United States Patent
Kim et al.

(10) Patent No.: US 9,548,368 B2
(45) Date of Patent: Jan. 17, 2017

(54) SEMICONDUCTOR DEVICE INCLUDING ION GEL MATERIAL AND ELECTRONIC DEVICE INCLUDING THE SEMICONDUCTOR DEVICE

(71) Applicant: SAMSUNG ELECTRONICS CO., LTD., Suwon-si (KR)

(72) Inventors: Unjeong Kim, Osan-si (KR);
Youngseon Shim, Yongin-si (KR);
Yeonsang Park, Seoul (KR);
Changwon Lee, Hwaseong-si (KR);
Sungwoo Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/712,041

(22) Filed: May 14, 2015

(65) Prior Publication Data
US 2015/0364472 A1 Dec. 17, 2015

(30) Foreign Application Priority Data
Jun. 12, 2014 (KR) .......................... 10-2014-0071488

(51) Int. Cl.
*H01L 29/06* (2006.01)
*H01L 29/08* (2006.01)
(Continued)

(52) U.S. Cl.
CPC ..... *H01L 29/42356* (2013.01); *H01L 27/1237* (2013.01); *H01L 29/1606* (2013.01); *H01L 29/51* (2013.01); *H01L 27/1207* (2013.01)

(58) Field of Classification Search
CPC ... H01L 29/1606; H01L 29/51; H01L 27/1237
(Continued)

(56) References Cited

U.S. PATENT DOCUMENTS

| 2007/0102747 A1* | 5/2007 | Chen ...................... B82Y 10/00 257/314 |
| 2010/0051913 A1* | 3/2010 | Takeya .................. H01L 51/052 257/40 |
| 2014/0072871 A1 | 3/2014 | Chen et al. |

FOREIGN PATENT DOCUMENTS

| KR | 10-2012-0130149 A | 11/2012 |
| WO | 2009/087793 A1 | 7/2009 |

OTHER PUBLICATIONS

Lee, et al., "Stretchable Graphene Transistors with Printed Dielectrics and Gate Electrodes", NANO Letters, American Chemical Society, 2011, 11, pp. 4642-4646.
(Continued)

*Primary Examiner* — Robert Huber
(74) *Attorney, Agent, or Firm* — Sughrue Mion, PLLC

(57) ABSTRACT

A semiconductor device, a method for manufacturing the same, and an electronic device including the same are provided. The semiconductor device includes a first transistor and a second transistor. The first transistor includes a first channel layer and a first ion gel. The second transistor includes a second channel layer and a second ion gel. The first channel layer and the second channel layer may include, for example, graphene. The first ion gel and the second ion gel include different ionic liquids. The first ion gel and the second ion gel include different cations and/or different anions. One of the first transistor and the second transistor is a p-type transistor, and the other one is an n-type transistor. The combination of the first transistor and the second transistor constitutes an inverter.

20 Claims, 11 Drawing Sheets

(51) Int. Cl.
  *H01L 29/423* (2006.01)
  *H01L 29/16* (2006.01)
  *H01L 29/51* (2006.01)
  *H01L 27/12* (2006.01)

(58) Field of Classification Search
  USPC .......................................... 257/29, E29.082
  See application file for complete search history.

(56) References Cited

OTHER PUBLICATIONS

Xu, et al., "Highly Stretchable Carbon Nanotube Transistors with Ion Gel Gate Dielectrics", NANO Letters, American Chemical Society, Received Oct. 21, 2013, total 5 pages.

Kim, et al., "High-Performance Flexible Graphene Field Effect Transistors with Ion Gel Gate Dielectrics", NANO Letters, American Chemical Society, 2010, 10, pp. 3464-3466.

Lee, et al., "Photo-patternable ion gel-gated graphene transistors and inverters on plastic", Nanotechnology, IOP Publishing, 2014, 25, 014002, total 7 pages.

Kim, et al., "High-Performance Supercapacitors Based on Poly(ionic liquid)-Modified Graphene Electrodes", ACS NANO, American Chemical Society, Received Aug. 10, 2010, total 7 pages.

Fujimoto, et al., "Electric-double-layer field-effect transistors with ionic liquids", Phys. Chem. Chem. Phys., RSC Publishing, 2013, 15, Published on Apr. 5, 2013, pp. 8983-9006.

* cited by examiner

US 9,548,368 B2

SEMICONDUCTOR DEVICE INCLUDING ION GEL MATERIAL AND ELECTRONIC DEVICE INCLUDING THE SEMICONDUCTOR DEVICE

RELATED APPLICATION

This application claims priority from Korean Patent Application No. 10-2014-0071488, filed on Jun. 12, 2014, in the Korean Intellectual Property Office, the disclosure of which is incorporated herein by reference in its entirety.

BACKGROUND

1. Field

Exemplary embodiments relate to semiconductor devices, methods of manufacturing the semiconductor devices, and electronic devices including the semiconductor devices.

2. Description of the Related Art

Recently, research into next-generation materials, such as two-dimensional (2D) materials like graphene and carbon nanotube (CNT), has been actively conducted. Graphene is a hexagonal single layer structure composed of carbon atoms and may exhibit structurally and chemically stable characteristics and electrically and physically excellent characteristics. For example, graphene may have a charge mobility ($\sim 2\times 10^5$ cm$^2$/Vs) that is about 100 or more times faster than that of silicon (Si) and a current density (about $10^8$ A/cm$^2$) that is about 100 or more times higher than that of copper (Cu). Graphene may also have a flexible characteristic and excellent transparency. Thus, graphene has drawn attention as a next generation material which is capable of overcoming the limitations of the existing elements.

Owing to the diverse advantages of graphene, research on applying graphene to various semiconductor devices and electronic devices has been conducted. For example, research on using graphene as a channel material for a transistor has been conducted. In this connection, research on and the development of elements other than a channel of the transistor by using graphene are required.

SUMMARY

Provided are electronic devices including a non-silicon based material, such as graphene, and an ion gel material contacting the non-silicon based material.

Provided are semiconductor devices for which characteristics are controlled by using an ion gel material.

Provided are complementary semiconductor devices having excellent performance.

Provided are semiconductor devices which are capable of operating at a low voltage.

Provided are semiconductor devices that may be manufactured as flexible devices.

Provided are semiconductor devices that may be manufactured as stretchable devices.

Provided are electronic devices which include semiconductor devices.

Additional aspects will be set forth in part in the description which follows and, in part, will be apparent from the description, or may be learned by practice of the presented exemplary embodiments.

According to an aspect of one or more exemplary embodiments, a semiconductor device includes a first transistor and a second transistor that is connected to the first transistor, wherein the first transistor includes a first channel layer and a first gate insulating layer, the first channel layer including graphene, and the first gate insulating later including a first ion gel, and wherein the second transistor includes a second channel layer and a second gate insulating layer, the second channel layer including graphene, and the second gate insulating layer including a second ion gel which is different from the first ion gel.

The first ion gel may include at least one from among a first cation and a first anion, and the second ion gel may include at least one from among a second cation which is different from the first cation and a second anion which is different from the first anion.

The first ion gel may include a first cation and a first anion, and the second ion gel may include the first cation and a second anion which is different from the first anion.

The first ion gel may include a first anion and a first cation, and the second ion gel may include the first anion and a second cation which is different from the first cation.

At least one from among the first ion gel and the second ion gel may include at least one cation selected from among 1-Ethyl-3-methylimidazolium (EMIM), 1-Methyl-3-methylimidazolium (DMIM), 1-Propyl-3-methylimidazolium (PMIM), 1-Butyl-1-methylpyrrolidinium (BMPyr), and 1-Butyl-3-methylpyridinium (BMPy) and at least one from among the first ion gel and the second ion gel may include at least one anion selected from among thiocyanate (SCN), dicyanamide (DCA), tetrafluoroborate (BF4), trifluoromethanesulfonate (OTF), and bi(trifluoromethanesulfonyl)imide (NTf2).

The first channel layer may have a first Dirac point, and the second channel layer may have a second Dirac point which is different from the first Dirac point due to a material difference between the first ion gel and the second ion gel.

A first one from among the first transistor and the second transistor may have a p-type transistor characteristic within a first voltage range, and a second one from among the first transistor and the second transistor may have an n-type transistor characteristic within the first voltage range.

A combination of the first transistor and the second transistor may constitute a complementary inverter.

The semiconductor device may include at least one from among a flexible device and a stretchable device.

At least one from among the first transistor and the second transistor may have a top-gate structure.

At least one from among the first transistor and the second transistor may have a bottom-gate structure.

At least one from among the first transistor and the second transistor may have a side-gate structure.

An electronic device may include the semiconductor device. The electronic device may include one from among a NAND device, a NOR device, an encoder, a decoder, a multiplexer (MUX), a de-multiplexer (DEMUX), a sense amplifier, an oscillator, and a static random access memory (SRAM).

According to another aspect of one or more exemplary embodiments, a semiconductor device includes a first transistor and a second transistor that is connected to the first transistor, wherein the first transistor includes a first channel layer and a first ion gel layer that is in contact with the first channel layer, wherein the second transistor includes a second channel layer and a second ion gel layer that is in contact with the second channel layer, and wherein the first ion gel layer includes a first material, and the second ion gel layer includes a second material that is different from the first material, and the first transistor has at least one characteristic that is different from a corresponding characteristic of the second transistor due to a material difference between the first ion gel layer and the second ion gel layer.

The first channel layer and the second channel layer may be formed of a same material.

Each of the first channel layer and the second channel layer may include graphene.

The first ion gel layer and the second ion gel layer may include different cations and/or different anions.

One of the first transistor and the second transistor may have a p-type transistor characteristic within a first voltage range, and other one may have an n-type transistor characteristic within the first voltage range.

A combination of the first transistor and the second transistor may constitute an inverter.

An electronic device may include the semiconductor device.

A combination of the first transistor and the second transistor may constitute a complementary inverter.

The semiconductor device may include one of a flexible device and a stretchable device.

At least one from among the first transistor and the second transistor may have a top-gate structure.

At least one from among the first transistor and the second transistor may have a bottom-gate structure.

At least one from among the first transistor and the second transistor may have a side-gate structure.

An electronic device may include the semiconductor device. The electronic device may include one from among a NAND device, a NOR device, an encoder, a decoder, a multiplexer (MUX), a de-multiplexer (DEMUX), a sense amplifier, an oscillator, and a static random access memory (SRAM).

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
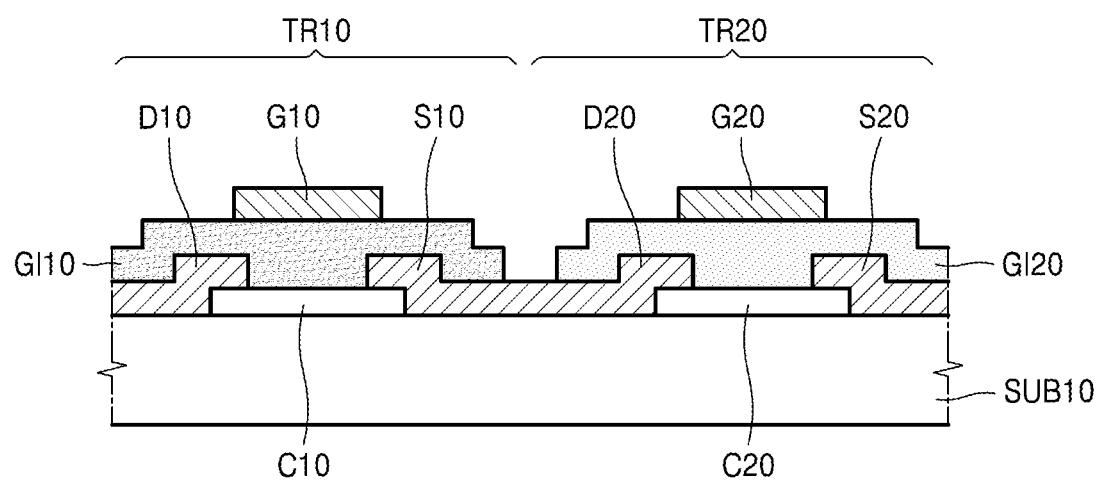
FIG. 1 is a cross-sectional view of a semiconductor device, according to an exemplary embodiment.

Various exemplary embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which the exemplary embodiments belong. It will be further understood that terms such as those defined in commonly-used dictionaries should be interpreted as having meanings consistent with their meanings in the context of the relevant art and will not be interpreted in an idealized or overly formal sense unless expressly so defined herein.

Hereinafter, nanostructures (plasmonic nanostructures), devices (optical devices) including the nanostructures, and methods of manufacturing the nanostructures and the devices according to exemplary embodiments will be described with reference to the accompanying drawings. In the drawings, the widths and thicknesses of layers and regions are exaggerated for clarity of illustration. Like reference numerals in the drawings denote like elements throughout.

FIG. 1 is a cross-sectional view of a semiconductor device, according to an exemplary embodiment.

Referring to FIG. 1, the semiconductor device may include first and second transistors TR10 and TR20 that are connected to each other. The first and second transistors TR10 and TR20 may be provided on a substrate SUB10. The substrate SUB10 may be a semiconductor substrate or an insulating substrate. The semiconductor substrate may be, for example, a silicon substrate. In this case, an insulating layer, such as a silicon oxide layer, may be provided on the silicon substrate. The substrate SUB10 may be a transparent substrate, an opaque substrate, a flexible substrate, or a stretchable substrate. However, the substrate SUB10 is not limited thereto and may be of other various types.

The first transistor TR10 may include a first channel layer C10, a first source electrode S10, a first drain electrode D10, a first gate insulating layer GI10, and a first gate electrode G10 that are provided on the substrate SUB10. The first source electrode S10 and the first drain electrode D10 may contact both ends of the first channel layer C10. The first gate insulating layer GI10 may be provided between the first channel layer C10 and the first gate electrode G10. The second transistor TR20 may include a second channel layer C20, a second source electrode S20, a second drain electrode D20, a second gate insulating layer GI20, and a second gate electrode G20 that are provided on the substrate SUB10. The second source electrode S20 and the second drain electrode D20 may contact both ends of the second channel layer C20. The second gate insulating layer GI20 may be provided between the second channel layer C20 and the second gate electrode G20. The second drain electrode D20 may be electrically connected to the first source electrode S10. Although a case where the second drain D20 is integrally formed with the first source electrode S10 is illustrated in FIG. 1, the second drain D20 and the first source electrode S10 may be separately provided, or a connection member for connecting the second drain D20 and the first source electrode S10 may be further provided.

Each of the first channel layer C10 and the second channel layer C20 may include graphene. In this aspect, the first and second transistor TR10 and TR20 may be "graphene transistors". The first and second channel layers C10 and C20 may be graphene layers. In this regard, the graphene layer may be a single graphene layer configured as one graphene sheet, or may have a structure in which a plurality of graphene layers (within a range from about 10 layers to about 100 layers) overlap each other are stacked. The first gate insulating layer GI10 may include a first ion gel. The second gate insulting layer GI20 may include a second ion gel which is different from the first ion gel. For example, the first gate insulating layer GI10 may be a first ion gel layer formed of the first ion gel, and the second gate insulating layer GI20 may be a second ion gel layer formed of the second ion gel. As the first and second gate insulating layers GI10 and GI20 include different ion gels, the first and second transistor TR10 and TR20 may have different respective characteristics. This will be described in more detail below.

The "ion gel" may include a mixture of ionic liquid and a polymer binder. The ionic liquid may have an excellent chemical stability and a wide electrochemical window. The ionic liquid may include at least one cation and at least one anion. The polymer binder may include an ultraviolet (UV) light curable polymer that is cured by UV light. In this case, the polymer binder may be cured when a predetermined photoinitiator is activated by UV light. The polymer binder may include a block copolymer other than the UV light curable polymer. The block copolymer may be, for example, a triblock copolymer. The ionic liquid and the polymer binder are mixed to induce a crosslink of a binder, and thus a material in a gel form in which the ionic liquid is present between crosslinked polymers, i.e., the ion gel, may be obtained. The ion gel may have a relatively high dielectric constant. For example, the ion gel may have a dielectric constant of about 10 or higher. Thus, if the ion gel is used to form a gate insulating layer of a transistor, the transistor may be driven at a low electric field, in comparison to a case where a given oxide insulating layer is used to form the gate insulating layer. The ion gel may flexible, stretchable, and also transparent.

The first ion gel included in the first gate insulating layer GI10 and the second ion gel included in the second gate insulating layer GI20 may include different ionic liquids. In particular, the first ion gel and the second ion gel may have different cations and/or different anions. For example, the first ion gel and the second ion gel may include identical cations and different anions or may include identical anions and different cations. Alternatively, the first ion gel and the second ion gel may include different cations and different anions. The first ion gel or the second ion gel may include cations selected from among EMIM, DMIM, PMIM, BMPyr, and BMPy and anions selected from among SCN, DCA, BF4, OTF, and NTf2. Chemical names of EMIM, DMIM, PMIM, BMPyr, BMPy, SCN, DCA, BF4, OTF, and NTf2 are listed in Table 1 below.

TABLE 1

| | | Chemical Names |
|---|---|---|
| Cations | EMIM | 1-Ethyl-3-methylimidazolium |
| | DMIM | 1-Methyl-3-methylimidazolium |
| | PMIM | 1-Propyl-3-methylimidazolium |
| | BMPyr | 1-Butyl-1-methylpyrrolidinium |
| | BMPy | 1-Butyl-3-methylpyridinium |
| Anions | SCN | Thiocyanate |
| | DCA | Dicyanamide |
| | BF4 | Tetrafluoroborate |
| | OTF | Trifluoromethanesulfonate |
| | NTf2 | bi(trifluoromethanesulfonyl)imide |

The first ion gel and the second ion gel may not have a same constitution (i.e., an identical cations/anions combination) and may include cations selected from among consisting of EMIM, DMIM, PMIM, BMPyr, and BMPy and anions selected from among SCN, DCA, BF4, OTF, and NTf2. However, the specific materials (cations/anions) of the first ion gel and the second ion gel above are just examples and may include other cations/anions.

Meanwhile, the polymer binder materials used to form the first ion gel and the second ion gel may include, for example, any of the UV light curable polymer such as PEG-DA, poly(MAGME), and PVA-Sbq or a polymer such as P(VDF-HFP), PS-PEO-PS, PS-PMMA-PS, PEI, and PAA that are not the UV light curable polymer. The chemical names of the polymer materials described above are listed in Table 2 below.

TABLE 2

| Polymer Binder | Chemical Names |
|---|---|
| PEG-DA | poly(ethylene glycol) diacrylate |
| poly(MAGME) | poly(methyl acrylamidoglycolate methyl ether) |
| PVA-Sbq | poly(vinyl alcohol)-N-methyl-4(4'-formylstyryl)pyridinium methosulfate acetal |
| P(VDF-HFP) | poly(vinylidene fluoride-co-hexafluoropropylene) |
| PS-PEO-PS | poly(styrene-block-ethylene oxide-block-styrene) |
| PS-PMMA-PS | poly(styrene-block-methyl methacrylate-block-styrene) |
| PEI | Polyethylenimine |
| PAA | poly(acrylic acid) |

When the UV light curable polymer is used as the polymer binder, the predetermined photoinitiator may be used. The photoinitiator may be, for example, 2-hydroxy-2-methylpropiophenone. As a specific example, the ion gel layer may be formed by mixing the ionic liquid including the cation and the anion of Table 1 and PEG-DA that is the UV curable polymer and 2-hydroxy-2-methylpropiophenone that is the photoinitiator at a mass ratio of about 88:8:4, spin coating a mixture on a predetermined material layer, and exposing and curing a coated layer to UV. However, this process and the above-described materials are examples, and may be modified in various ways.

As described above, as the first and second gate insulating layers GI10 and GI20 include different ion gels, the first and second transistors TR10 and TR20 may have different respective characteristics. Although the first channel layer C10 of the first transistor TR10 and the second channel layer C20 of the second transistor TR20 are formed of a same material (for example, graphene), corresponding characteristics of the first and second transistors TR10 and TR20 may be different due to a difference in the ion gel materials of the first and second gate insulating layers GI10 and GI20 since a Dirac point of the corresponding channels layers (graphene) C10 and C20 may be different according to the ion gel materials of the first and second gate insulating layers GI10 and GI20. As a result, one of the first and second transistors TR10 and TR20, for example, the first transistor TR10, may have a p-type transistor characteristic within a predetermined voltage range (hereinafter, referred to as a first voltage range), and the other one, for example, the second transistor TR20, may have an n-type transistor characteristic within the first voltage range. Thus, according to an exemplary embodiment, although a same channel material is used, the two transistors TR10 and TR20 having the p and n-type characteristics may be manufactured, and a complementary device that connects the two transistors TR10 and TR20 may be implemented. The complementary device may be a complementary inverter.

Hereinafter, the respective characteristics of the first and second transistors TR10 and TR20 that are different from each other due to the difference in the ion gel materials of the first and second gate insulating layers GI10 and GI20 of FIG. 1 will now be described in more detail.

Figure 2:
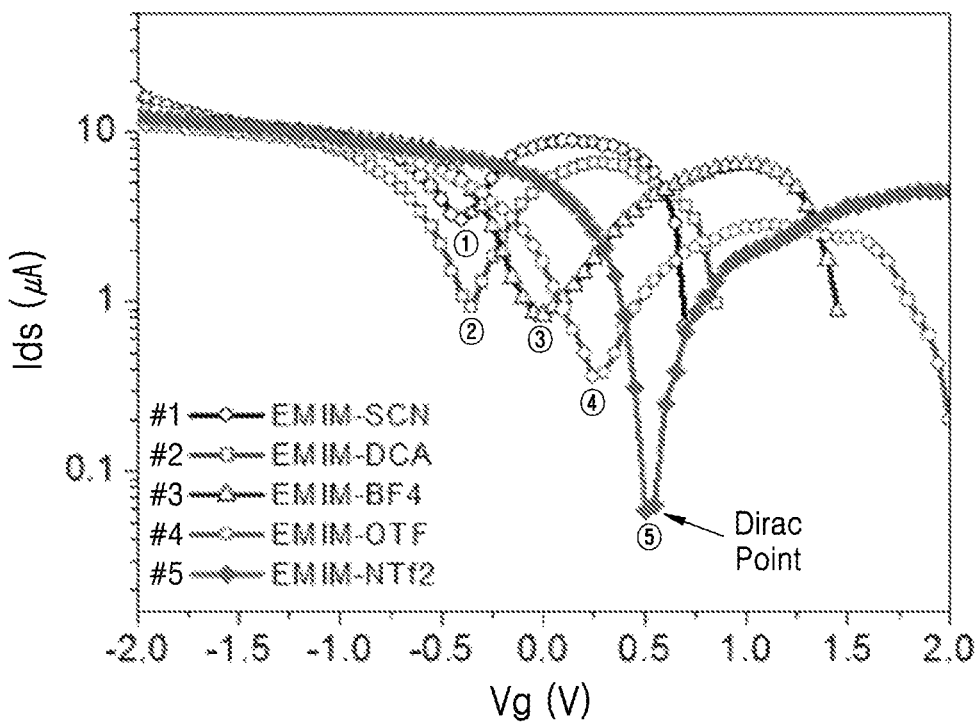
FIG. 2 is a graph illustrating a result obtained by evaluating a change in a transfer curve of a transistor including a graphene channel with changes in an ion gel material of a gate insulating layer of the transistor, according to an exemplary embodiment.

FIG. 2 is a graph illustrating a result obtained by evaluating a change in a transfer curve of a transistor (graphene transistor) including a graphene channel with changes in an ion gel material of a gate insulating layer of the transistor, according to an exemplary embodiment. A characteristic of the graphene transistor is measured when an ion gel includes EMIM cations and anions respectively selected from among SCN, DCA, BF4, OTF, and NTf2. In particular, in FIG. 2, the graphene transistors of sample #1 through sample #4, respectively, include EMIM-SCN, EMIM-DCA, EMIM-BF4, EMIM-OTF, and EMIM-NTf2 as materials of ion gel gate insulating layers (gate dielectric layers). The chemical names and molecular weights (g/mol) of the materials are listed in Table 3 below.

TABLE 3

| | Chemical Names | Molecular Weights (g/mol) |
|---|---|---|
| EMIM-SCN | 1-Ethyl-3-methylimidazolium thiocyanate | 169.25 |
| EMIM-DCA | 1-Ethyl-3-methylimidazolium dicyanamide | 177.21 |
| EMIM-BF4 | 1-Ethyl-3-methylimidazolium tetrafluoroborate | 197.97 |
| EMIM-OTF | 1-Ethyl-3-methylimidazolium trifluoromethanesulfonate | 260.24 |
| EMIM-NTf2 | 1-Ethyl-3-methylimidazolium bi(trifluoromethanesulfonyl)imide | 391.31 |

A gate voltage variation with a drain current is measured when a molecular weight of anions increases (i.e., anions are respectively selected from SCN, DCA, BF4, OTF and NTf2) while identical EMIM cations are included in the ion gel. In this regard, a drain voltage of 10 mV is considered.

Referring to FIG. 2, since the molecular weight of anions increases, that is, since types of anions are changed to SCN, DCA, BF4, OTF, and NTf2, the transfer curve of the transistor may move in a positive (+) direction. Each transfer curve has a characteristic, i.e., an ambipolar characteristic, that when a gate voltage increases, a drain current is reduced and increases with respect to a specific point. The point in which the drain current is reduced and increases may correspond to the Dirac point. Thus, since the molecular weight of anions included in the ion gel increases, the Dirac point of the graphene channel included in the transistor may move in the positive (+) direction. The Dirac point may be a point in which a type of the transistor is changed, i.e. a type change point. Thus, since the molecular weight of anions included in the ion gel increases, the type change point of the transistor may move in the positive (+) direction.

Figure 3:
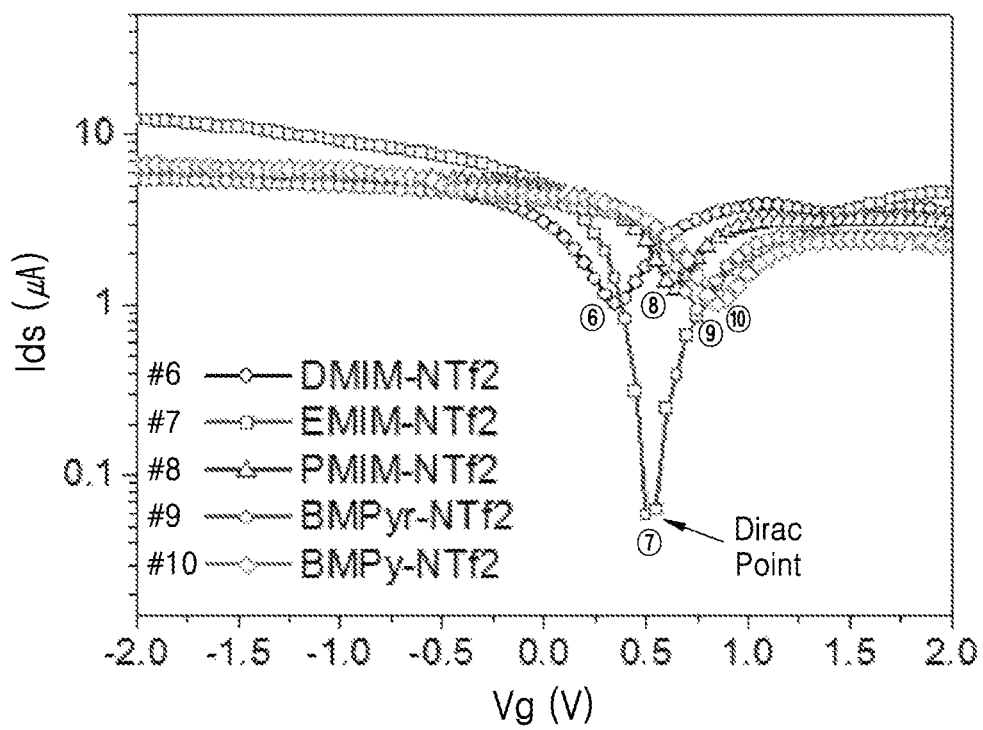
FIG. 3 is a graph illustrating a result obtained by evaluating a change in a transfer curve of a transistor including a graphene channel which changes an ion gel material of a gate insulating layer of the transistor, according to another exemplary embodiment.

FIG. 3 is a graph illustrating a result obtained by evaluating a change in a transfer curve of a transistor (graphene transistor) including a graphene channel which changes an ion gel material of a gate insulating layer of the transistor, according to another exemplary embodiment. A characteristic of the graphene transistor is measured when an ion gel includes NTf2 cations and anions respectively selected from among DMIM, EMIM, PMIM, BMPyr, and BMPy. In particular, in FIG. 3, the graphene transistors of sample #6 through sample #10, respectively, include DMIM-NTf2, EMIM-NTf2, PMIM-NTf2, BMPyr-NTf2, and BMPy-NTf2 as materials of ion gel gate insulating layers (gate dielectric layers). The chemical names and molecular weights (g/mol) of the materials are listed in Table 4 below.

TABLE 4

|  | Chemical Names | Molecular Weights (g/mol) |
| --- | --- | --- |
| DMIM-NTf2 | 1-Methyl-3-methylimidazolium bi(trifluoromethanesulfonyl)imide | 377.29 |
| EMIM-NTf2 | 1-Ethyl-3-methylimidazolium bi(trifluoromethanesulfonyl)imide | 391.31 |
| PMIM-NTf2 | 1-Propyl-3-methylimidazolium bi(trifluoromethanesulfonyl)imide | 405.34 |
| BMPyr-NTf2 | 1-Butyl-1-methylpyrrolidinium bi(trifluoromethanesulfonyl)imide | 422.41 |
| BMPy-NTf2 | 1-Butyl-3-methylpyridinium bi(trifluoromethanesulfonyl)imide | 430.34 |

A gate voltage variation with a drain current is measured when a molecular weight of cations increases (i.e., cations are respectively selected from DMIM, EMIM, PMIM, BMPyr, and BMPy) while identical NTf2 anions are included in the ion gel. In this regard, a drain voltage of 10 mV is considered.

Referring to FIG. 3, since the molecular weight of cations increases, that is, since types of cations are changed to DMIM, EMIM, PMIM, BMPyr, and BMPy, the transfer curve of the transistor may move in a positive (+) direction. Thus, since the molecular weight of cations included in the ion gel increases, a Dirac point of the graphene channel included in the transistor may move in the positive (+) direction. Since the molecular weight of cations included in the ion gel increases, a type change point of the transistor may move in the positive (+) direction.

Figure 4A:
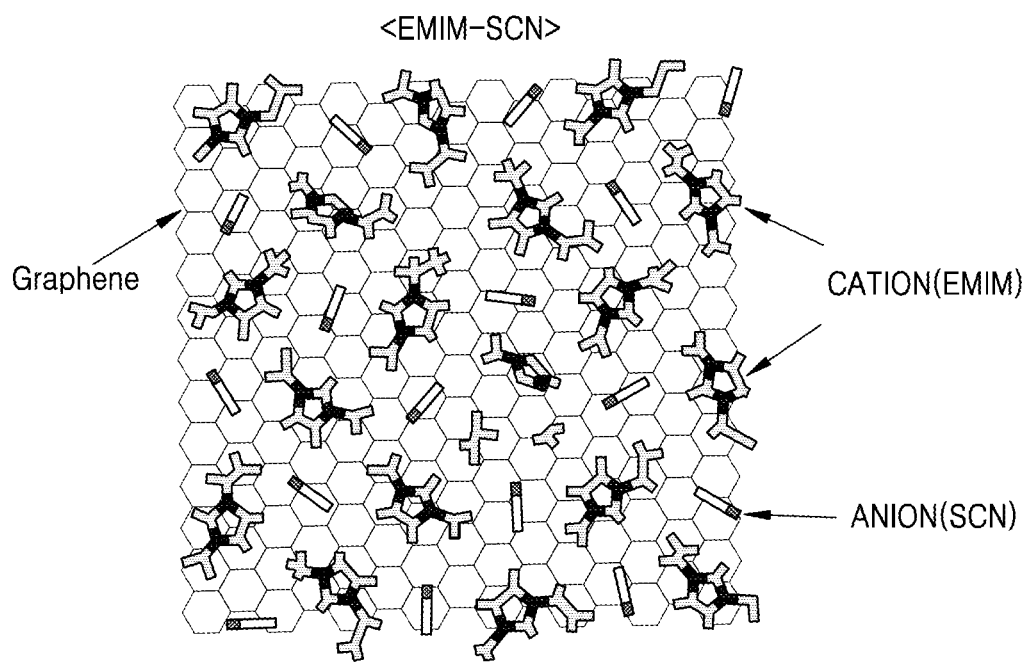
FIGS. 4A and 4B are images showing an arrangement shape and structure of EMIM-SCN molecules and EMIM-NTf2 molecules that are distributed in graphene via a molecular dynamic simulation.
Figure 4B:
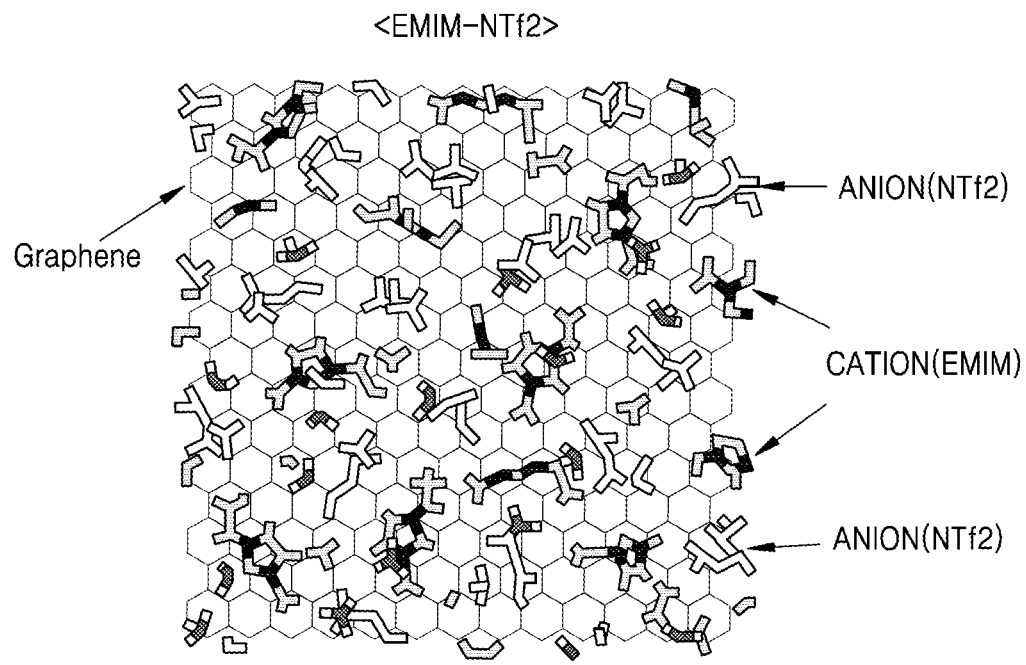

FIGS. 4A and 4B are images showing an arrangement shape and structure of EMIM-SCN molecules and EMIM-NTf2 molecules that are distributed in graphene via a molecular dynamic simulation.

Referring to FIG. 4A, EMIM that are cations have a ring structure that is generally parallel to the structure of graphene. The ring structure may be an imidazolium ring. Meanwhile, SCN that are anions have a small size and are distributed between cations. In this regard, an electrical influence may be applied to graphene according to the ring structure of cations adjacent to graphene.

Referring to FIG. 4B, NTf2 that are anions may have a relatively large size and occupy a large area. An arrangement shape and distribution of EMIM that are cations are different from those of FIG. 4A. A ring structure of EMIM may be arranged to be relatively greatly inclined to a graphene surface, and a number of molecules of EMIM per unit area may be smaller than that of FIG. 4A. In this case, an influence of cations to graphene may be reduced and an influence of anions to graphene may be increased.

Influences of cations and anions to graphene may be changed according to arrangements, structures, and distributions of cations and anions that are disposed to be adjacent to graphene. Thus, an electrical characteristic of graphene may be changed, and a characteristic of a transistor including graphene may be changed by changing types of cations and/or anions.

A principle/mechanism of producing phenomena of FIGS. 2 and 3 will now be described below. In this regard, simulation results of FIGS. 4A and 4B are referred to as necessary.

The principle/mechanism of producing phenomena of FIGS. 2 and 3 may be summarized below.

First, a charge distribution of an ion layer adjacent to graphene may determine a symbol and a size of charges induced to graphene. Second, a size and structure of anions adjacent to graphene may change an arrangement type of cations and the number of cations per unit area, and accordingly, an electrical characteristic of graphene may be changed. Third, cations having pi electrons, such as an imidazolium ring, are arranged by being pi-stacked on a graphene surface. The imidazolium ring is arranged closer to and parallel to graphene. The greater the number of cations per unit area, the greater the negative (−) charges induced to graphene may increase. Fourth, the greater the chain length of the cations, the smaller the number of the cations per unit area and the greater the extent to which the negative (−) charges induced to graphene may be reduced.

Since NTf2 of FIG. 4B have a larger size than that of SCN of FIG. 4A, NTf and EMIM may form a relatively thick ion layer around graphene. In the ion layer, an imidazolium ring of cations may be arranged to be relatively greatly inclined to a graphene surface, a pi-stacking structure of cations is broken, and thus a positive charge density of the ion layer may be reduced in a region adjacent to graphene. As a result, a p-doping effect of inducing positive charges to graphene may be produced, and a Dirac point may move in a positive (+) direction. Meanwhile, when an anion has a small size (as illustrated, for example, in FIG. 4A), a ring structure of a cation may be parallel to graphene, a relatively thin ion layer may be formed, and a positive charge density of the ion layer may increase in an area adjacent to graphene. Thus, an n-doping effect of inducing a negative charge to graphene may be produced. Similarly as described above, as the molecular weight of the anions included in the ion gel of FIG. 2 increases, a Dirac point of graphene may move in the positive (+) direction.

When NTf2 anions are included in the ion gel and the molecular weight of cations is changed (as illustrated, for example, in FIG. 3), there is a tendency that as the molecular weight of cations increases, the Dirac point of graphene may move in the positive (+) direction. When the molecular weight of cations increases by increasing a length of an alkyl chain connected to an imidazolim ring of cations, i.e., when the ion gel respectively includes DMIM, EMIM, and PMIM cations, as the length of the alkyl chain increases, a number of cations per unit area may be reduced near graphene. Thus, as the molecular weight of cations increases, the positive charge density of the ion layer in the area adjacent to graphene may be reduced. As a result, the Dirac point of graphene may move in the positive (+) direction. When a pyrrolidinium-based positive ion other than an imidazolium-based positive ion is used, since an arrangement/locations of positive ions with respect to graphene may be inclined in a direction in which the positive charge density of the ion layer is reduced, the Dirac point of graphene may move more toward the positive (+) direction. When the molecular weight of cations increases because of the length of the alkyl chain connected to the imidazolim ring, the Dirac point of graphene may move in the positive (+) direction. This tendency of the Dirac point moving in the positive (+) direction may be seen in FIG. 3. However, the principle/mechanism regarding the results of FIGS. 2 and 3 described above are examples, and other principles/mechanisms may occur.

Figure 5:
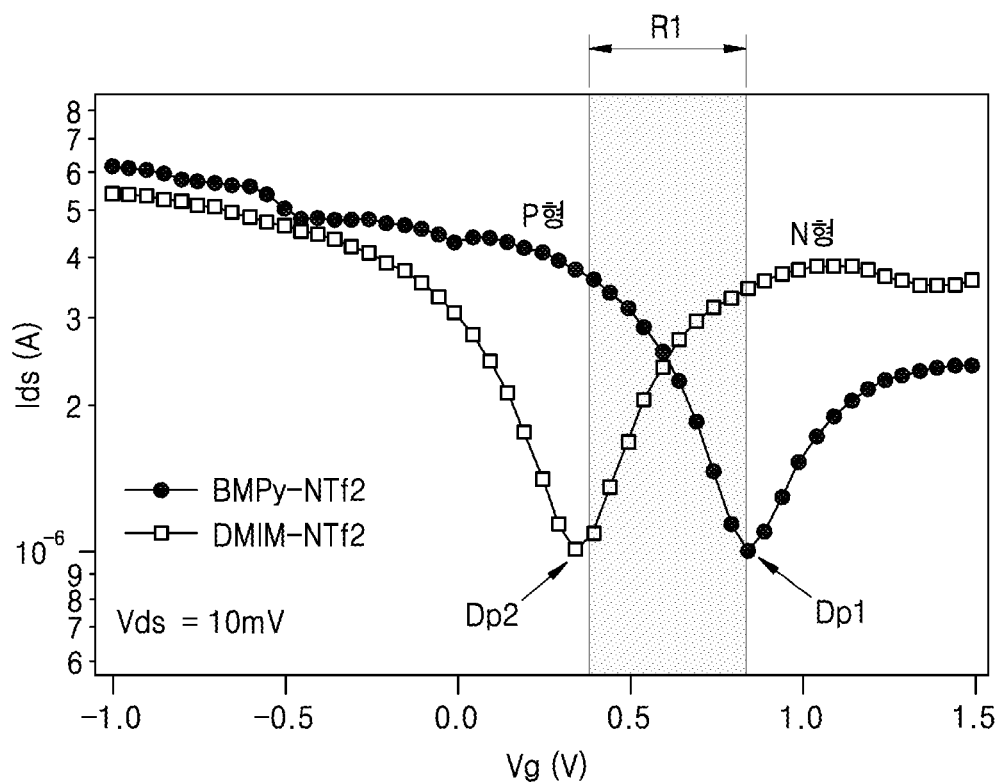
FIG. 5 is a graph illustrating transfer curves of a first transistor including a first ion gel material as a gate insulator and a second transistor including a second ion gel material as the gate insulator, according to an exemplary embodiment.

FIG. 5 is a graph illustrating transfer curves of a first transistor including a first ion gel material as a gate insulator and a second transistor including a second ion gel material as the gate insulator, according to an exemplary embodiment. The first and second transistors may be graphene transistors which include graphene as a channel material. The first ion gel material may include BMPy-NTf2 as an ionic liquid. The second ion gel material may include DMIM-NTf2 as an ionic liquid.

As shown in FIG. 5, a Dirac point Dp1 of the first transistor, which includes the first ion gel material (i.e., BMPy-NTf2), may be located to the right with respect to a Dirac point Dp2 of the second transistor, which includes the second ion gel material (i.e., DMIM-NTf2). Thus, the first transistor may have a p-type transistor characteristic, and the second transistor may have an n-type transistor characteristic within a predetermined voltage range R1. In particular, although a same channel material (i.e., graphene) is used, if different ion gel materials are used as gate insulating layer materials, two transistors having opposite types may be implemented.

The first and second transistors of FIG. 5 may respectively correspond to the first and second transistors TR10 and TR20 of FIG. 1. Thus, the first transistor TR10 of FIG. 1 may have the p-type transistor characteristic, and the second transistor TR20 of FIG. 1 may have the n-type transistor characteristic. According to an exemplary embodiment, a complementary inverter may be produced by using a combination of the two transistors TR10 and TR20 of FIG. 1. The complementary inverter may have various advantages in terms of performance and operating methods, as compared to an inverter having a different structure. An example of a complementary inverter circuit having the structure of FIG. 1 is illustrated in FIG. 6.

Figure 6:
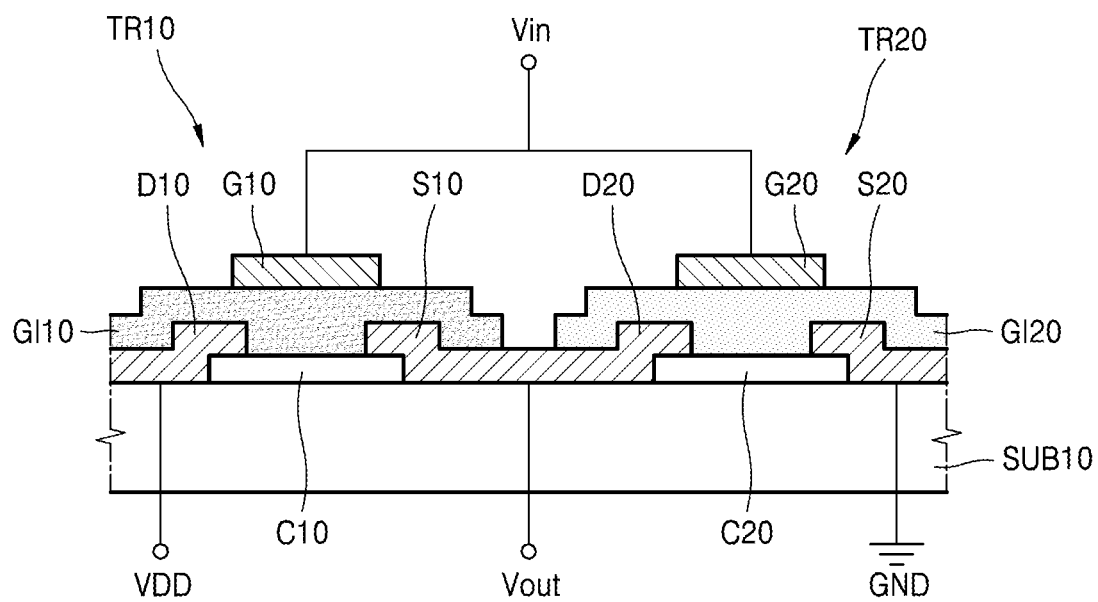
FIG. 6 is a cross-sectional view of a semiconductor device, according to another exemplary embodiment.

Referring to FIG. 6, a power terminal VDD may be connected to a first drain electrode D10. An input terminal Vin may be connected to the first and second gate electrodes G10 and G20. The first source electrode S10 and the second drain electrode D20 may be commonly connected to an output terminal Vout. The second source electrode S20 may be grounded. A reference numeral GND denotes a ground terminal. The first transistor TR10 may operate as a p-type transistor and the second transistor TR20 may operate as an n-type transistor within a predetermined voltage range, and thus a semiconductor device of FIG. 6 may be used as a complementary inverter.

Although the two transistors TR10 and TR20 have a top gate structure in FIGS. 1 and 6, according to another exemplary embodiment, at least one of the two transistors TR10 and TR20 may have a bottom gate structure. An example in this regard is illustrated in FIG. 7.

Figure 7:
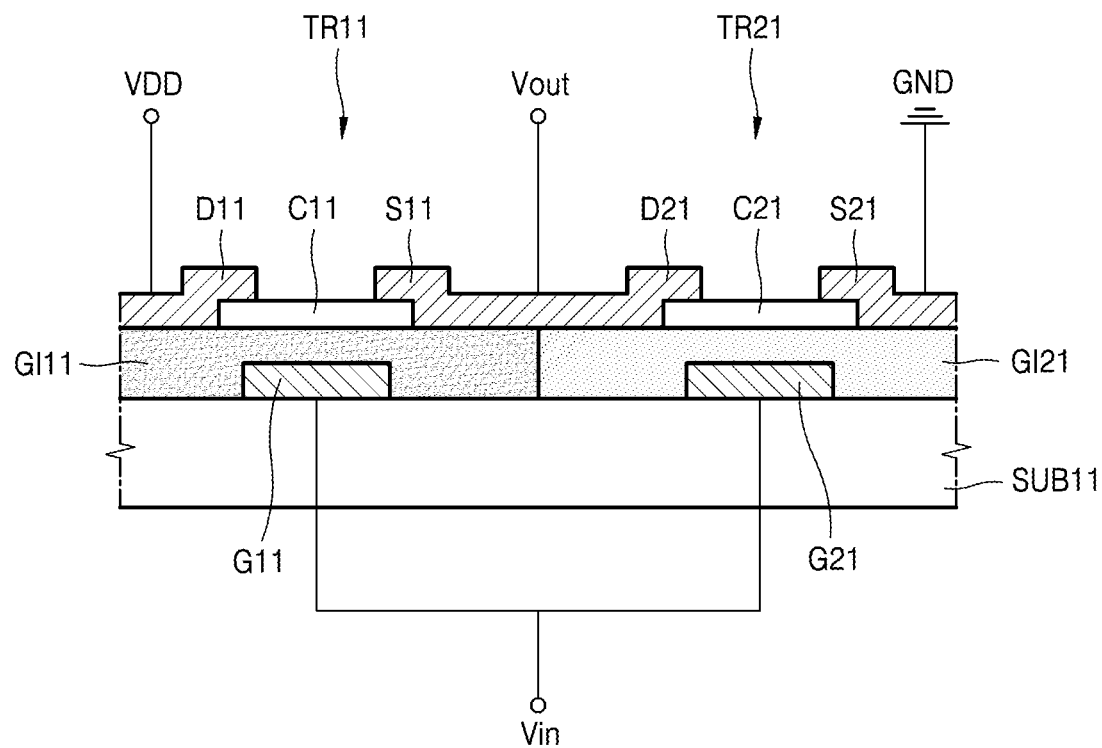
FIG. 7 is a cross-sectional view of a semiconductor device, according to another exemplary embodiment.

FIG. 7 is a cross-sectional view of a semiconductor device, according to another exemplary embodiment.

Referring to FIG. 7, first and second transistors TR11 and TR21 that are connected to each other may be provided on a substrate SUB11. The first transistor TR11 may include a first gate electrode G11, a first gate insulating layer GI11 covering the first gate electrode G11, a first channel layer C11 provided on the first gate insulating layer GI11, and a first source electrode S11 and a first drain electrode D11 that contact both ends of the first channel layer C11. Similarly, the second transistor TR21 may include a second gate electrode G21, a second gate insulating layer GI21 covering the second gate electrode G21, a second channel layer C21 provided on the second gate insulating layer GI21, and a second source electrode S21 and the second drain electrode D21 that contact both ends of the second channel layer C21. The first and second channel layers C11 and C21 may include graphene. The first gate insulating layer GI11 may include a first ion gel material. The second gate insulating layer GI21 may include a second ion gel material. The first ion gel material and the second ion gel material may be respectively same as or similar to the first ion gel material of the first transistor TR10 and the second ion gel material of the second transistor TR20 of FIG. 1. Thus, one of the first and second transistors TR11 and TR21, for example, the first transistor TR11, may have a p-type transistor characteristic, and another one, for example, the second transistor TR21, may have an n-type transistor characteristic.

Terminals VDD, Vin, Vout, and GND that are connected to the electrodes S11, S21, D11, D21, G11, and G21 of the first and second transistors TR11 and TR21 may be further provided. Connections between the terminals VDD, Vin, Vout, and GND and the electrodes S11, S21, D11, D21, G11, and G21 may be similar to those illustrated in FIG. 6.

According to another exemplary embodiment, the two gate electrodes G11 and G21 may be replaced with one common gate electrode. An example in this regard is illustrated in FIG. 8.

Figure 8:
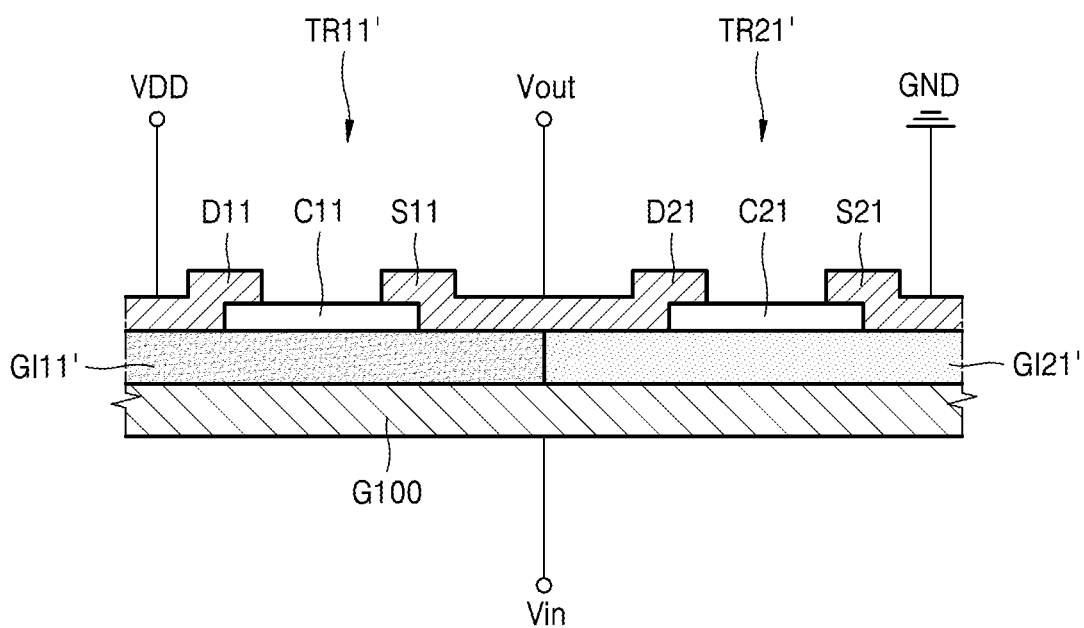
FIG. 8 is a cross-sectional view of a semiconductor device, according to another exemplary embodiment.

Referring to FIG. 8, a first gate insulating layer GI11' including a first ion gel material and a second gate insulating layer GI21' including a second ion gel material may be provided on a common gate electrode G100. The first channel layer C11, the first source electrode S11, and the first drain electrode D11 may be provided on the first gate insulating layer GI11'. The second channel layer C21, the second source electrode S21, and the second drain electrode D21 may be provided on the second gate insulating layer GI21'. The terminals VDD, Vin, Vout, and GND that are connected to the electrodes S11, S21, D11, D21, and G100 of the first and second transistors TR11' and TR21' may be further provided.

According to another exemplary embodiment, at least one of two transistors included in a semiconductor device may have a side gate structure. An example in this regard is illustrated in FIG. 9.

Figure 9:
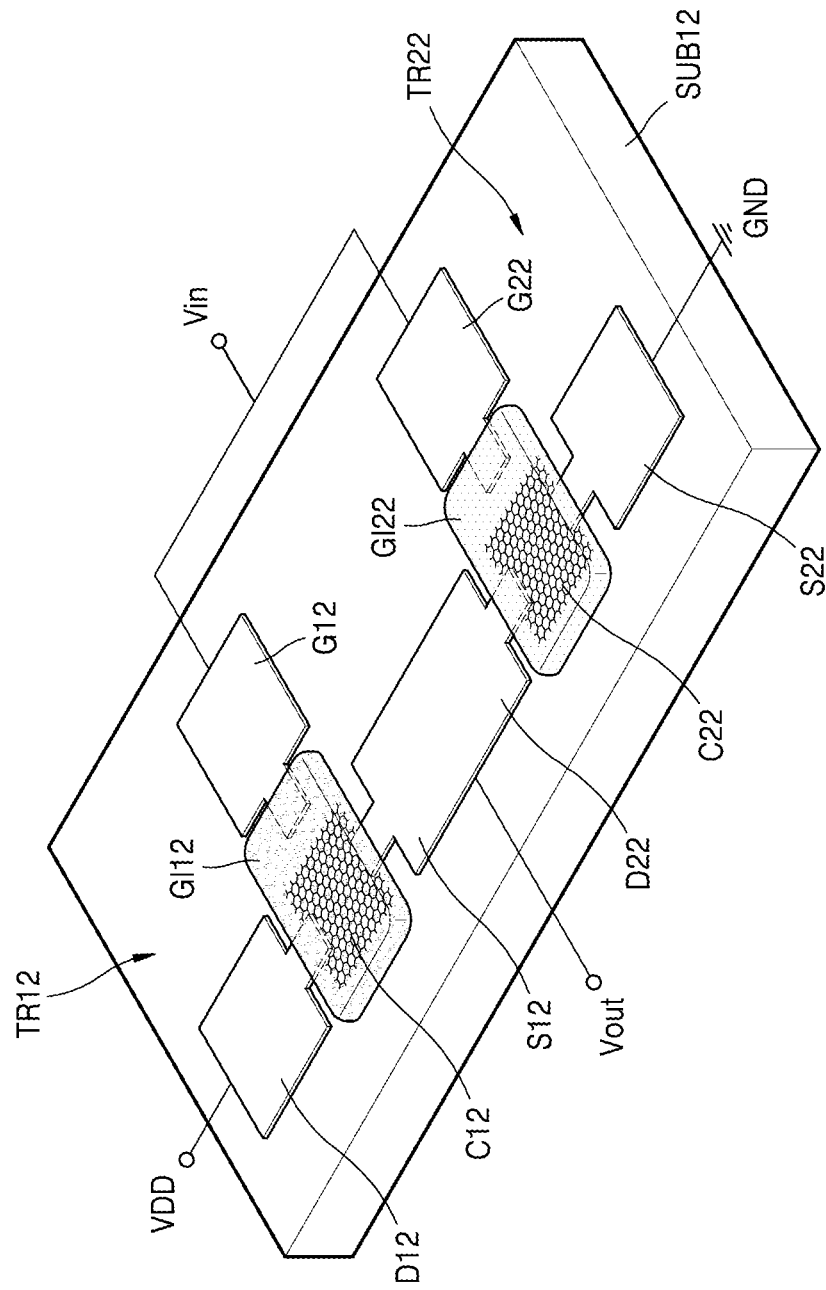
FIG. 9 is a perspective view of a semiconductor device, according to an exemplary embodiment.

FIG. 9 is a perspective view of a semiconductor device, according to an exemplary embodiment.

Referring to FIG. 9, a first transistor TR12 and a second transistor TR22 may be provided on a substrate SUB12. The first transistor TR12 may include a first channel layer C12 provided on the substrate SUB12, a first source electrode S12 and a first drain electrode D12 that contact both ends of the first channel layer C12, and a first gate electrode G12 spaced apart from the first channel layer C12 in a side direction. The first transistor TR12 may include a first gate insulating layer GI12 covering the first channel layer C12. The first gate insulating layer GI12 may cover a part of the first source electrode S12, a part of the first drain electrode D12, and a part of the first gate electrode G12. The first gate insulating layer GI12 may include a first ion gel material. The second transistor TR22 may have a structure similar to that of the first transistor TR12. In particular, the second transistor TR22 may include a second channel layer C22, a second source S22 and a second drain electrode D22 that contact both ends of the second channel layer C22, and a second gate electrode G22 spaced apart from the second channel layer C22 in a side direction. The second transistor TR22 may include a second gate insulating layer GI22 covering the second channel layer C22. The second gate insulating layer GI22 may include a second ion gel material which is different from the first ion gel. The first ion gel material and the second ion gel material may be respectively same as or similar to the first ion gel of the first transistor TR10 and the second ion gel of the second transistor TR20 that are described with reference to FIG. 1 above. Thus, one of the first and second transistors TR12 and TR22, for example, the first transistor TR12, may have a p-type transistor characteristic, and another one, for example, the second transistor TR22, may have an n-type transistor characteristic.

Terminals VDD, Vin, Vout, and GND that are connected to the electrodes S12, S22, D12, D22, G12, and G22 of the first and second transistors TR12 and TR22 may be further provided. Connections between the terminals VDD, Vin, Vout, and GND and the electrodes S12, S22, D12, D22, G12, and G22 may be similar to those illustrated in FIG. 6.

Figure 10:
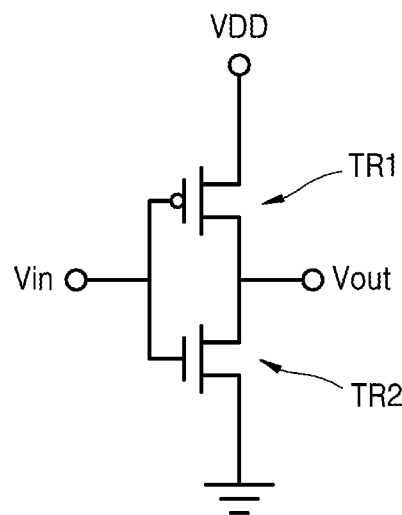
FIG. 10 is a circuit diagram of a semiconductor device (inverter), according to an exemplary embodiment.

The semiconductor devices (inverters) of FIGS. 6, 7, 8, and 9 may have a circuit configuration of FIG. 10. In this aspect, FIG. 10 is a circuit diagram of a semiconductor device (inverter), according to an exemplary embodiment. In this regard, the first transistor TR1 may correspond to the first transistors TR10~TR12 of FIGS. 6, 7, 8, and 9, and the second transistor TR2 may correspond to the second transistors TR20~TR22 of FIGS. 6, 7, 8, and 9.

Referring to FIG. 10, a first transistor T1 and a second transistor T2 are connected to each other. The first transistor T1 may be a p-type transistor. The second transistor TR2 may be an n-type transistor. A power terminal VDD may be connected to a drain of the first transistor TR1. An output terminal Vout may be commonly connected to a source of the first transistor TR1 and a drain of the second transistor TR2. A source of the second transistor TR2 may be grounded. An input terminal Vin may be connected to a first gate electrode of the first transistor TR1 and a second gate electrode of the second transistor TR2. As described above, on/off states of the first and second transistors TR1 and TR2 may be controlled and a different signal may be output via the output terminal Vout according to an input signal (voltage) applied to the first and second gate electrodes via the input terminal Vin.

Figure 11:
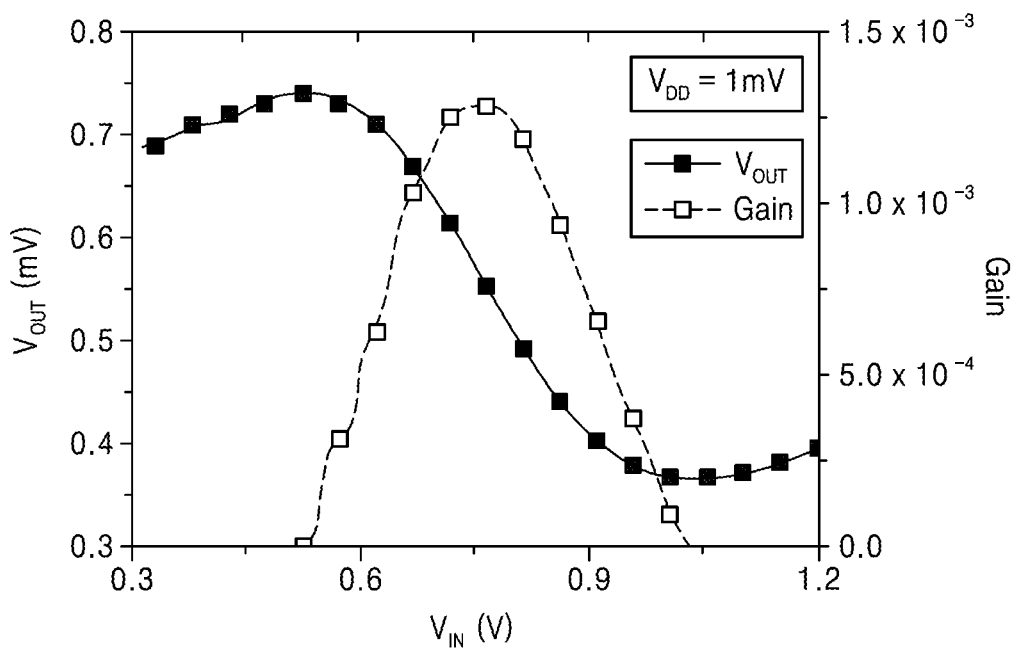
FIGS. 11, 12, and 13 are graphs showing results obtained by measuring a characteristic of a complementary inverter including two transistors, according to exemplary embodiments.
Figure 12:
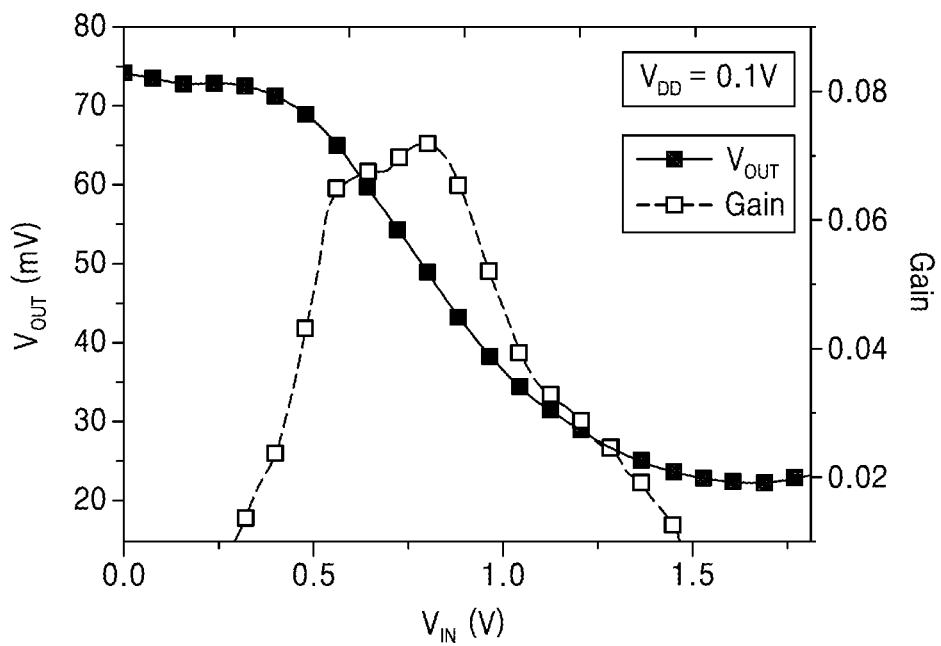
Figure 13:
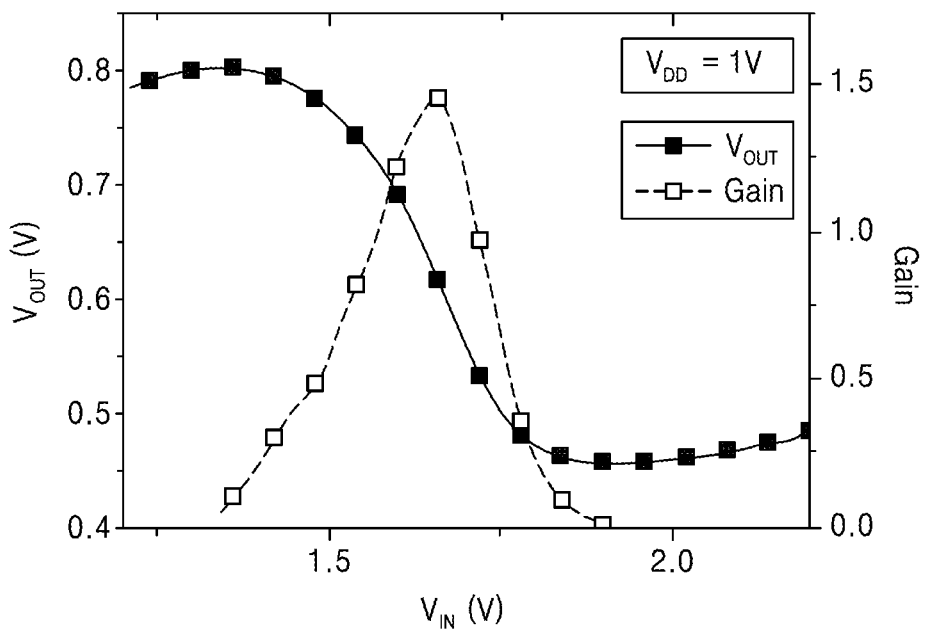

FIGS. 11, 12, and 13 are graphs showing results obtained by measuring a characteristic of a complementary inverter including two transistors, according to exemplary embodiments. FIG. 11 shows a measurement result when a power voltage $V_{DD}$ is 1 mV. FIG. 12 shows a measurement result when a power voltage $V_{DD}$ is 0.1 V. FIG. 13 shows a measurement result when a power voltage $V_{DD}$ of 1 V.

Referring to FIGS. 11, 12, and 13, it may be seen that a relatively excellent inverter characteristic varies from a high level of an output voltage $V_{OUT}$ to a low level thereof according to a change in an input voltage $V_{IN}$. In particular, it may be seen from the results of FIGS. 11 and 12 that the inverter characteristic is present although the power voltage $V_{DD}$ is very low, i.e., below 0.1 V. This means that when a complementary inverter is implemented by using two transistors according to an exemplary embodiment, an inverter operation is possible at a very low power voltage $V_{DD}$. If an inverter is configured by connecting two ambipolar transistors having a same characteristic, the inverter operation may be possible only when the power voltage $V_{DD}$ is higher than 1 V or several volts. However, according to an exemplary embodiment, two graphene transistors originally having p and n-type characteristics are used when the power voltage $V_{DD}$ is not applied, and thus a graphene-based inverter that is capable of operating at the very low power voltage $V_{DD}$ may be implemented.

Figure 14:
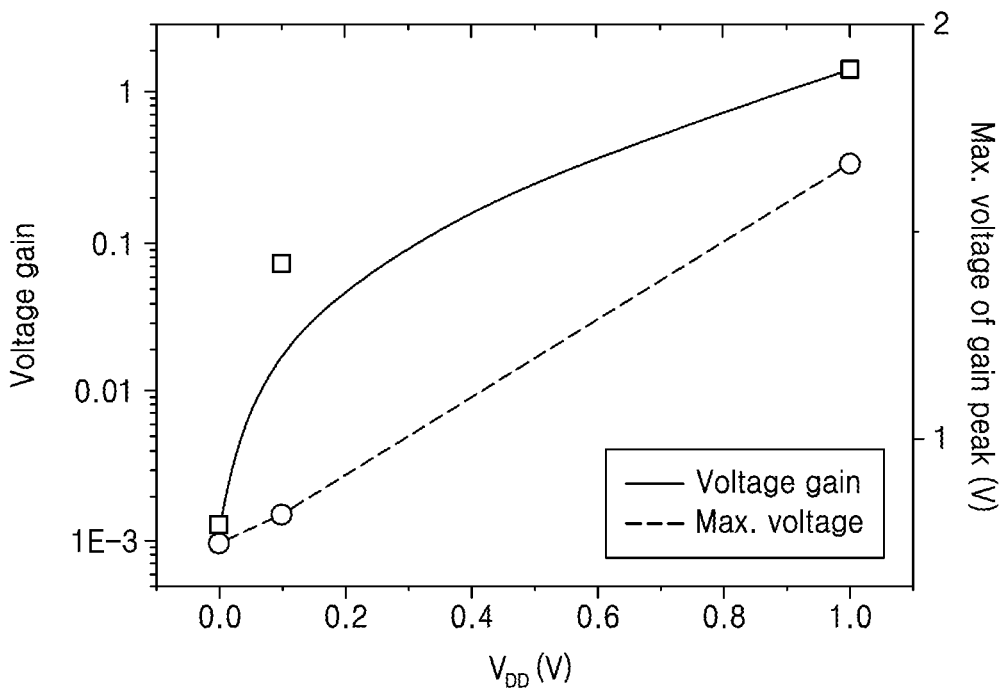
FIG. 14 is a graph showing changes in a voltage gain and a maximum voltage of a gain peak with respect to a change in a power voltage applied to an inverter, according to an exemplary embodiment.

FIG. 14 is a graph showing changes in a voltage gain and a maximum voltage of a gain peak with respect to a change in a power voltage applied to an inverter, which are obtained from the results of FIGS. 11, 12, and 13, according to an exemplary embodiment. Referring to FIG. 14, it may be seen that the higher the increase of the power voltage $V_{DD}$, the greater both the voltage gain and the maximum voltage of the gain peak.

Semiconductor devices according to the exemplary embodiments described above may be flexible devices or stretchable devices. Graphene of the channel layers C10~C22 and ion gel materials of the gate insulating layers GI10~GI22 may have a flexible or stretchable characteristic. When the gate electrodes G10~G22 have a structure in which carbon nanotube (CNT), a metal nanowire, graphene, etc. are embedded in a polymer layer, the gate electrodes G10~G22 may have the flexible or stretchable characteristic. Alternatively, when a liquid metal is applied to the gate electrodes G10~G22, the gate electrodes G10~G22 may also have a flexible or stretchable characteristic. Similarly to the gate electrodes G10~G22, the source/drain electrodes S10~S22 and D10~D22 may be manufactured to have a flexible or stretchable characteristic. According to circumstances, two areas of a graphene pattern may be used as a source electrode and a drain electrode, and a graphene area between the source electrode and the drain electrode may be used as a channel area. In this case, the source/drain electrode having the flexible or stretchable characteristic may be obtained. Thus, according to an exemplary embodiment, a flexible or stretchable semiconductor device may be implemented.

The semiconductor devices according to the exemplary embodiments described above may be used as basic factors of various circuits. For example, the semiconductor devices according to the exemplary embodiments may be applied to the inverters described above, and may be used as basic factors of a logic gate, such as a NAND device and a NOR device, and any of various electronic devices, such as an encoder, a decoder, a multiplexer (MUX), a de-multiplexer (DEMUX), a sense amplifier, an oscillator, etc. The oscillator may be a ring oscillator. The semiconductor devices according to the exemplary embodiments may be applied as factors of a memory device, such as a static random access memory (SRAM). Circuit configurations of the logic gate, the encoder, the decoder, the MUX, the DEMUX, the sense amplifier, the oscillator, and the SRAM are well known, and thus detailed descriptions thereof are omitted.

An example of a method of manufacturing a semiconductor device according to an exemplary embodiment will now be described below.

FIGS. 15A, 15B, 15C, 15D, and 15E are cross-sectional views for explaining a method of manufacturing a semiconductor device, according to an exemplary embodiment.

Figure 15A:
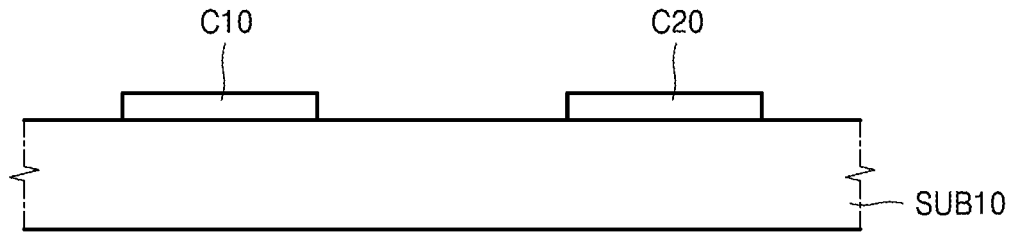
FIGS. 15A, 15B, 15C, 15D, and 15E are cross-sectional views for explaining a method of manufacturing a semiconductor device, according to an exemplary embodiment.

Referring to FIG. 15A, the first and second channel layers C10 and C20 may be formed on the substrate SUB10. The first and second channel layers C10 and C20 may include, for example, graphene. The first and second channel layers C10 and C20 may be graphene layers. The substrate SUB10 may be a semiconductor substrate or an insulating substrate. The semiconductor substrate may be, for example, a silicon substrate. In this case, an insulating layer such as a silicon oxide layer, may be provided on the silicon substrate. The substrate SUB10 may be a transparent substrate, an opaque substrate, or a flexible or stretchable substrate. A type of the substrate SUB10 is not limited thereto.

Figure 15B:
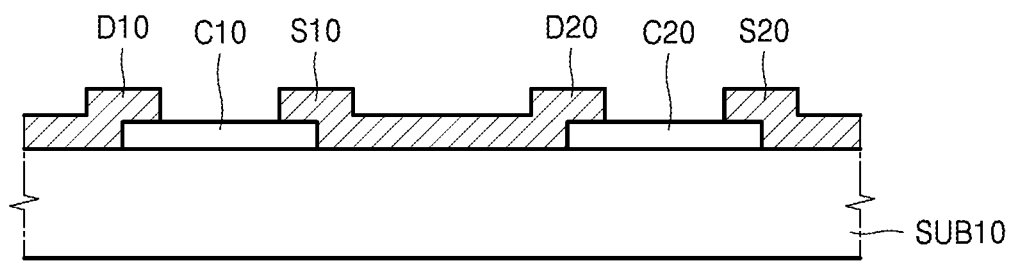

Referring to FIG. 15B, the first source electrode S10 and the first drain electrode D10 that contact both ends of the first channel layer C10 and the second source electrode S20 and the second drain electrode D20 that contact both ends of the second channel layer C20 may be formed on the substrate SUB10. The first source electrode S10 and the second drain electrode D20 may be electrically connected to each other. For example, the first source electrode S10 and the second drain electrode D20 may be formed as an integral electrode. However, according to circumstances, the first source electrode S10 and the second drain electrode D20 may be separately formed and then a connection member for connecting the first source electrode S10 and the second drain electrode D20 may be further formed.

Figure 15C:
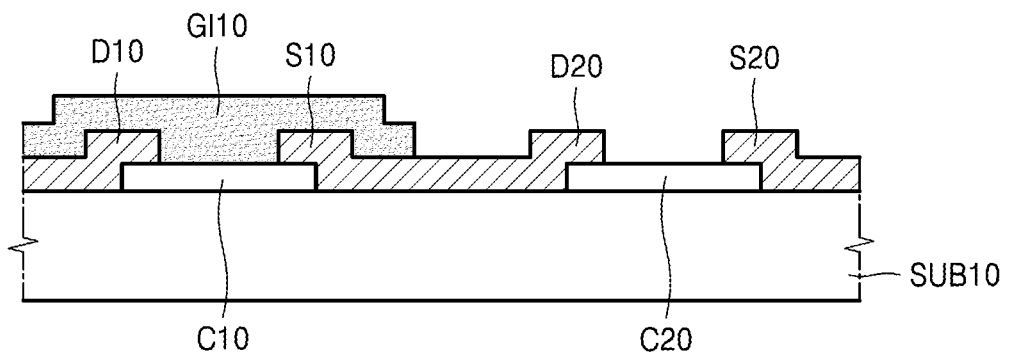

Referring to FIG. 15C, the first gate insulating layer GI10, which includes a first ion gel, may be formed on the first channel layer C10. For example, the second channel layer C20 and a peripheral area thereof are covered by a predetermined mask layer (not shown), and then the first gate insulating layer GI10 may be selectively formed on the first channel layer C10. Thereafter, the mask layer may be removed. When the first ion gel included in the first gate insulating layer GI10 includes a UV light curable polymer, the first gate insulating layer GI10 may be formed by performing a process of irradiating UV. A material of the first gate insulating layer GI10 may be the same as or similar to that of the first gate insulating layer GI10 described with reference to FIG. 1 above.

Figure 15D:
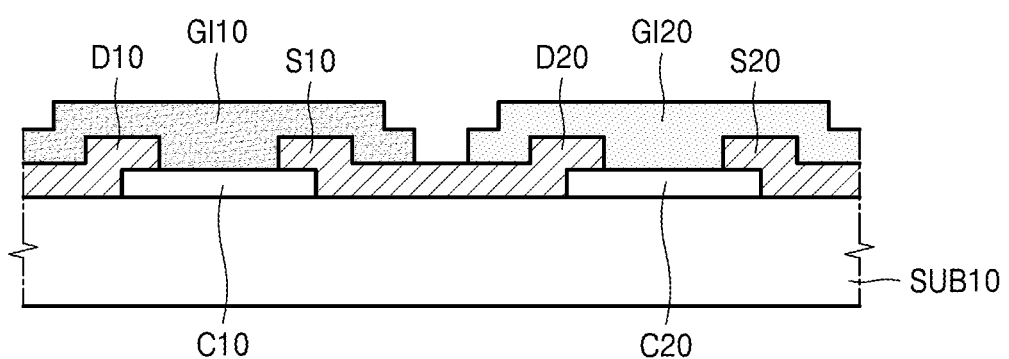

Referring to FIG. 15D, the second gate insulating layer GI20, which includes a second ion gel, may be formed on the second channel layer C20. For example, a mask layer (not shown) that covers the first gate insulating layer GI10 is formed, and then the second gate insulating layer GI20 may be selectively formed on the second channel layer C20. When the second gate insulating layer GI20 is formed, a process of irradiating UV light may be performed according to circumstances. A material of the second gate insulating layer GI20 may be the same as or similar to that of the second gate insulating layer GI20 described with reference to FIG. 1 above.

The methods of forming the first and second gate insulating layers GI10 and GI20 of FIGS. 15C and 15D may be modified in various ways. For example, the first and second gate insulating layers GI10 and GI20 may be formed by using a nozzle printing method. A predetermined mask pattern which includes a first opening that exposes the first channel layer C10 and a second opening that exposes the second channel layer C20 is formed on a structure of FIG. 15B, and then the nozzle printing method is used to form a first ion gel material in the first opening and a second ion gel material in the second opening, and thus the first gate insulating layer GI10 including the first ion gel material and the second gate insulating layer GI20 including the second ion gel material may be formed. In addition, the methods of forming the first and second gate insulating layers GI10 and GI20 may be modified in various ways. As a specific example, the first and second gate insulating layers GI10 and GI20 may be formed by using any of various lithography processes or a lift-off process.

Figure 15E:
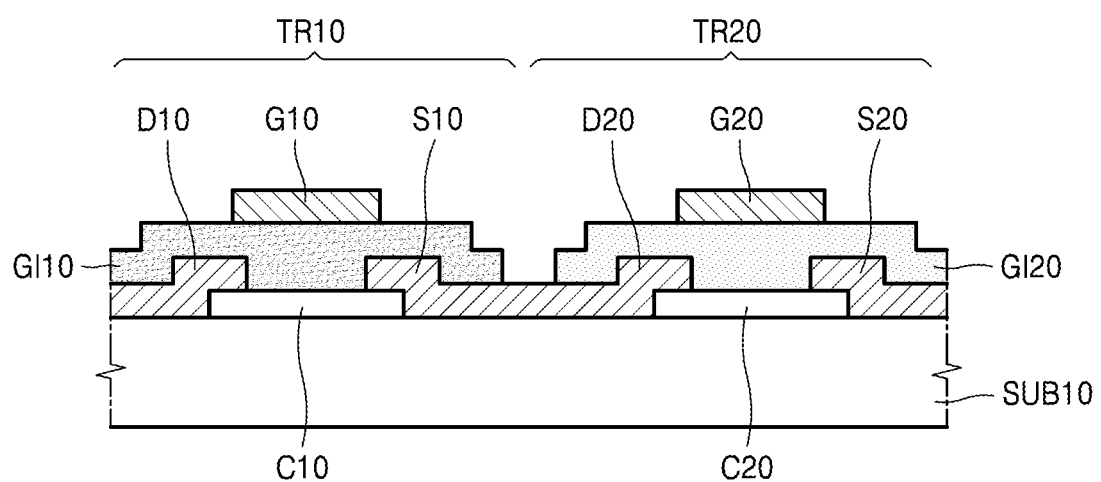

Referring to FIG. 15E, the first gate electrode G10 and the second gate electrode G20 may be respectively formed on the first gate insulating layer GI10 and the second gate insulating layer GI20. The first channel layer C10, the first source electrode S10, the first drain electrode D10, the first gate electrode G10, and the first gate insulating layer GI10 may constitute the first transistor TR10. The second channel layer C20, the second source electrode S20, the second drain electrode D20, the second gate electrode G20, and the second gate insulating layer GI20 may constitute the second transistor TR20. The first transistor TR10 and the second transistor TR20 may respectively correspond to the first transistor TR10 and the second transistor TR20 of FIGS. 1 through 6.

Figure 16A:
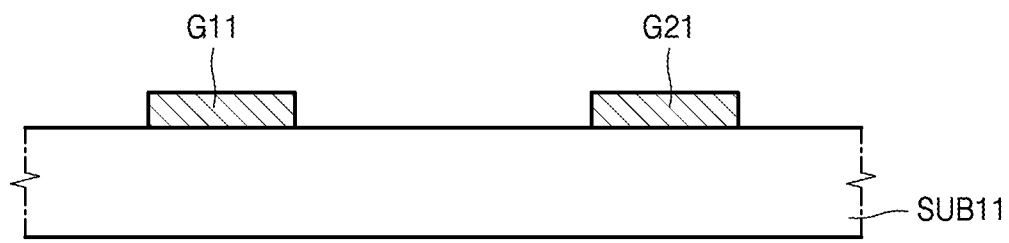
FIGS. 16A, 16B, and 16C are cross-sectional views for explaining a method of manufacturing a semiconductor device, according to another exemplary embodiment.
Figure 16B:
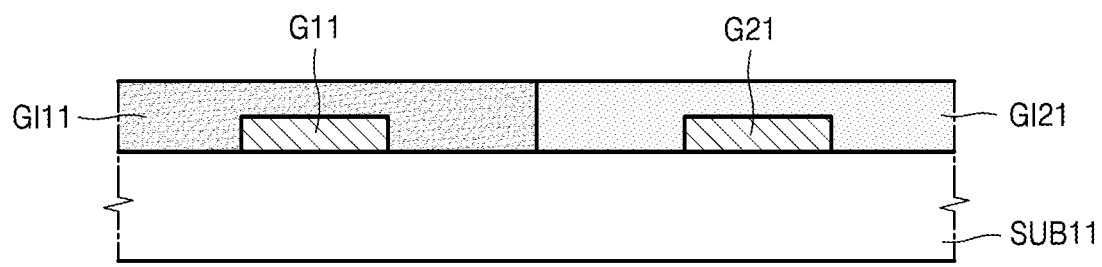
Figure 16C:
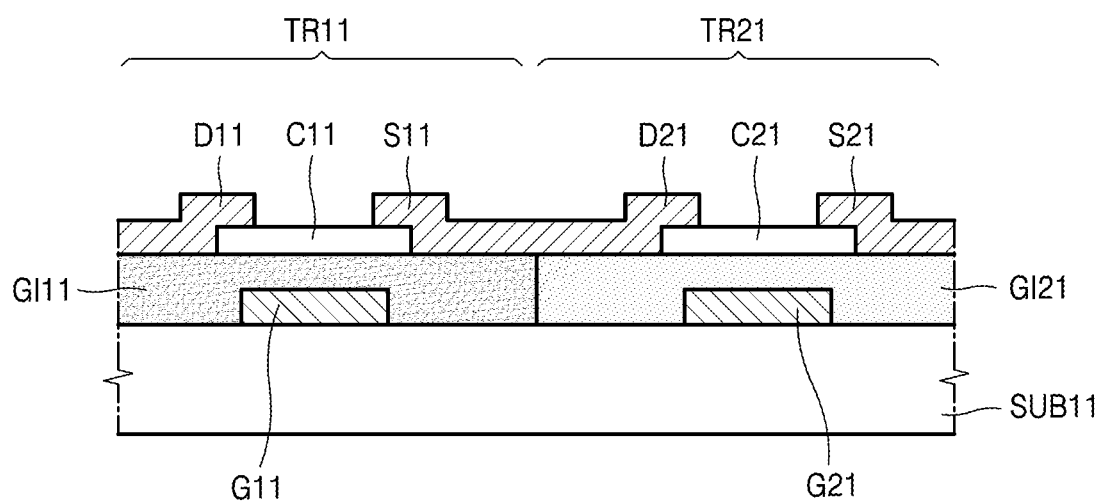

FIGS. 16A, 16B, and 16C are cross-sectional views for explaining a method of manufacturing a semiconductor device, according to another exemplary embodiment.

Referring to FIG. 16A, the first gate electrode G11 and the second gate electrode G21 that are spaced apart from each other may be formed on the substrate SUB11.

Referring to FIG. 16B, the first gate insulating layer GI11, which covers the first gate electrode G11, and the second gate insulating layer GI21, which covers the second gate electrode G21, may be formed on the substrate SUB11. The first gate insulating layer GI11 may include a first ion gel material. The second gate insulating layer GI21 may include a second ion gel material which is different from the first ion gel material. Methods of forming the first and second gate insulating layers GI11 and GI21 may be the same as or similar to those described with reference to FIGS. 15C and 15D above. The first and second gate insulating layers GI11 and GI21 may be formed by using various modification methods.

Referring to FIG. 16C, the first channel layer C11 and the second channel layer C21 may be respectively formed on the first gate insulating layer GI11 and the second gate insulating layer GI21. The first channel layer C11 and the second channel layer C21 may include, for example, graphene. The first channel layer C11 and the second channel layer C21 may be graphene layers. Then, the first source electrode S11 and the first drain electrode D21 that contact both ends of the first channel layer C11 and the second source electrode S11 and the second drain electrode D21 that contact both ends of the second channel layer C21 may be formed. The first source electrode S11 and the second drain electrode D21 may be electrically connected to each other.

The first channel layer C11, the first source electrode S11, the first drain electrode D11, the first gate electrode G11, and the first gate insulating layer GI11 may constitute the first transistor TR11. The second channel layer C21, the second source electrode S21, the second drain electrode D21, the second gate electrode G21, and the second gate insulating layer GI21 may constitute the second transistor TR21. The first transistor TR11 and the second transistor TR21 may respectively correspond to the first transistor TR11 and the second transistor TR21 of FIG. 7.

Although the methods of manufacturing the semiconductor devices having the structures of FIGS. 6 and 7 have been described with reference to FIGS. 15A, 15B, 15C, 15D, 15E, 16A, 16B, and 16C above, the methods may also be utilized to manufacture the semiconductor devices having various modification structures of FIGS. 8 and 9. The semiconductor devices may be applied to any of a logic gate such as a NAND device and a NOR device, an encoder, a decoder, a MUX, a DEMUX, a sense amplifier, an oscillator, an SRAM, etc.

While exemplary embodiments have been described above, they should be construed not as limiting the scope of the present inventive concept but merely as examples. For example, it will be understood by those of ordinary skill in the art that various changes in the configurations of the semiconductor devices (inverters) illustrated in FIGS. 1, 6, 7, 8, and 9 may be made. As a specific example, the channel layers C10~C22 may include graphene and other materials or may be formed of materials other than graphene, and locations and structures of the electrodes S10~S22, D10~D22, and G10~G22 may be modified in various ways. The transistors TR10~TR22 may have a double gate structure, and the channel layers C10~C22 may be patterned in various forms. The methods of manufacturing the semiconductor devices described with reference to FIGS. 15A through 16C may also be modified in various ways. The semiconductor devices according to the exemplary embodiments may be applied to various electronic devices/electronic apparatuses for various purposes. Therefore, the scope of the present inventive concept is defined not by the detailed description of the exemplary embodiments but by the technical spirits set forth in the appended claims.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

What is claimed is:

1. A semiconductor device comprising a first transistor and a second transistor that is connected to the first transistor,
    wherein the first transistor comprises a first channel layer and a first gate insulating layer, the first channel layer comprising graphene, and the first gate insulating layer comprising a first ion gel,
    wherein the second transistor comprises a second channel layer and a second gate insulating layer, the second channel layer comprising graphene, and the second gate insulating layer comprising a second ion gel which is different from the first ion gel, and
    wherein the first ion gel comprises at least one from among a first cation and a first anion, and wherein the second ion gel comprises at least one from among a second cation which is different from the first cation and a second anion which is different from the first anion.

2. The semiconductor device of claim 1, wherein the first ion gel comprises the first cation and the first anion, and wherein the second ion gel comprises the first cation and the second anion which is different from the first anion.

3. The semiconductor device of claim 1, wherein the first ion gel comprises the first anion and the first cation, and wherein the second ion gel comprises the first anion and the second cation which is different from the first cation.

4. The semiconductor device of claim 1, wherein at least one from among the first ion gel and the second ion gel comprises at least one cation selected from among 1-Ethyl-3-methylimidazolium (EMIM), 1-Methyl-3-methylimidazolium (DMIM), 1-Propyl-3-methylimidazolium (PMIM), 1-Butyl-1-methylpyrrolidinium (BMPyr), and 1-Butyl-3-methylpyridinium (BMPy), and wherein at least one from among the first ion gel and the second ion gel comprises at least one anion selected from among thiocyanate (SCN), dicyanamide (DCA), tetrafluoroborate (BF4), trifluoromethanesulfonate (OTF), and bi(trifluoromethanesulfonyl)imide (NTf2).

5. A semiconductor device comprising a first transistor and a second transistor that is connected to the first transistor,
    wherein the first transistor comprises a first channel layer and a first gate insulating layer, the first channel layer comprising graphene, and the first gate insulating layer comprising a first ion gel,
    wherein the second transistor comprises a second channel layer and a second gate insulating layer, the second channel layer comprising graphene, and the second gate insulating layer comprising a second ion gel which is different from the first ion gel, and
    wherein the first channel layer has a first Dirac point, and the second channel layer have a second Dirac point which is different from the first Dirac point due to a material difference between the first ion gel and the second ion gel.

6. The semiconductor device of claim 1, wherein a first one from among the first transistor and the second transistor has a p-type transistor characteristic within a first voltage range, and a second one from among the first transistor and the second transistor has an n-type transistor characteristic within the first voltage range.

7. The semiconductor device of claim 1, wherein a combination of the first transistor and the second transistor constitutes a complementary inverter.

8. The semiconductor device of claim 1, wherein the semiconductor device includes at least one from among a flexible device and a stretchable device.

9. The semiconductor device of claim 1, wherein at least one from among the first transistor and the second transistor has a top-gate structure.

10. The semiconductor device of claim 1, wherein at least one from among the first transistor and the second transistor has a bottom-gate structure.

11. The semiconductor device of claim 1, wherein at least one from among the first transistor and the second transistor has a side-gate structure.

12. An electronic device comprising the semiconductor device of claim 1.

13. The electronic device of claim 12, wherein the electronic device includes one from among a NAND device, a NOR device, an encoder, a decoder, a multiplexer (MUX), a de-multiplexer (DEMUX), a sense amplifier, an oscillator, and a static random access memory (SRAM).

14. A semiconductor device comprising a first transistor and a second transistor that is connected to the first transistor,
    wherein the first transistor comprises a first channel layer and a first ion gel layer that is in contact with the first channel layer,
    wherein the second transistor comprises a second channel layer and a second ion gel layer that is in contact with the second channel layer, and
    wherein the first ion gel layer comprises a first material, and the second ion gel layer comprises a second material that is different from the first material, and the first transistor has at least one characteristic that is different from a corresponding characteristic of the second transistor due to a material difference between the first ion gel layer and the second ion gel layer.

15. The semiconductor device of claim 14, wherein the first channel layer and the second channel layer are formed of a same material.

16. The semiconductor device of claim 14, wherein each of the first channel layer and the second channel layer comprises graphene.

17. The semiconductor device of claim 14, wherein the first ion gel layer comprises at least one from among a first cation and a first anion, and wherein the second ion gel comprises at least one from among a second cation which is different from the first cation and a second anion which is different from the first anion.

18. The semiconductor device of claim 14, wherein a first one from among the first transistor and the second transistor has a p-type transistor characteristic within a first voltage range, and a second one from among the first transistor and the second transistor has an n-type transistor characteristic within the first voltage range.

19. The semiconductor device of claim 14, wherein a combination of the first transistor and the second transistor constitutes an inverter.

20. An electronic device comprising the semiconductor device of claim 14.

* * * * *